(12) United States Patent
Chan et al.

(10) Patent No.: US 7,676,769 B2
(45) Date of Patent: Mar. 9, 2010

(54) ADAPTIVE THRESHOLD WAFER TESTING DEVICE AND METHOD THEREOF

(75) Inventors: Lai Chung Chan, Austin, TX (US); Jon C. Baker, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 216 days.

(21) Appl. No.: 11/678,971

(22) Filed: Feb. 26, 2007

(65) Prior Publication Data

US 2008/0206903 A1 Aug. 28, 2008

(51) Int. Cl.
*G06F 17/50* (2006.01)
(52) U.S. Cl. .................................. 716/1; 716/4; 716/19
(58) Field of Classification Search .................... 716/1, 716/4, 19
See application file for complete search history.

(56) References Cited

U.S. PATENT DOCUMENTS

| | | | |
|---|---|---|---|
| 6,167,545 | A | 12/2000 | Statovici et al. |
| 6,304,095 | B1 | 10/2001 | Miyamoto |
| 6,618,682 | B2 | 9/2003 | Bulaga et al. |
| 7,073,107 | B2 | 7/2006 | Madge et al. |
| 7,243,316 | B2 * | 7/2007 | White et al. ................... 716/4 |

OTHER PUBLICATIONS

Rojsuman, Rochit; "Iddq Testing for CMOS VLSI"; Proceedings of the IEEE, vol. 8, No. 4; Apr. 2000.
Manhaeve, Hans et al.; "A Real World Application Used to Implement a True IDDQ Based Test Strategy (Facts and Figures)"; Proceedings of the Seventh IEEE European Test Workshop; 2002.
Soden, Jerry M. et al.; "IDDQ Testing: A Review"; Journal of Electronic Testing: Theory and Applications, 3, 291-303; 1992; Kluwer Academic Publishers, Boston.
Keshavarzi, Ali et al.; "Intrinsic Leakage in Low Power Deep Submicron CMOS ICs"; International Test Conference, Paper 7.3; pp. 146-155; 1997; IEEE.
Rajsuman, Rochit; "Design-for-Iddq-Testing for Embedded Cores Based System-on-a-Chip"; 1998; IEEE.

* cited by examiner

*Primary Examiner*—Thuan Do

(57) ABSTRACT

Techniques for testing a semiconductor wafer are disclosed. One technique includes measuring a parameter for each of the semiconductor dies in a region of the wafer and determining an adaptive threshold for the region based on the measured parameters. The parameter measured for each die in the region is then compared to the adaptive threshold to determine a qualification status for each die. Accordingly, the semiconductor dies of the wafer are qualified based on an adaptive threshold that varies according to the wafer region under test. This allows for detection of dies whose parameters vary significantly from other dies in a region, providing for detection of potentially faulty dies whose parameter measurements otherwise meet a fixed threshold set for the entire wafer, such as a Single Threshold Test Limit (STL) expectation for the wafer.

19 Claims, 5 Drawing Sheets

ADAPTIVE THRESHOLD WAFER TESTING DEVICE AND METHOD THEREOF

FIELD OF THE DISCLOSURE

The present disclosure relates to testing of electronic devices and more particularly to testing of semiconductor wafers.

BACKGROUND

Each die of a semiconductor wafer typically is tested to determine if the operational characteristics for the die are within specified limits. Conventional tests apply a Single Threshold Test Limit (STL) to test each die. The STL is a single fixed threshold for the semiconductor wafer for a measured parameter. Accordingly, If a measured parameter for a die exceeds the STL, this indicates that the die will not operate according to specifications and the die is typically disqualified for operation and discarded. However, because of process variations in the formation of the wafer, some failed dies will not be detected through application of an STL test. Accordingly, an improved technique for detecting failed dies would be advantageous.

DETAILED DESCRIPTION

FIGS. 1-6 disclose techniques for testing a semiconductor wafer. One technique includes measuring a parameter for each of the semiconductor dies in a region of the wafer and determining an adaptive threshold for the region based on the measured parameters. The parameter measured for each die in the region is then compared to the adaptive threshold to determine a qualification status for each die. Accordingly, the semiconductor dies of the wafer are qualified based on an adaptive threshold that varies according to the wafer region under test. This allows for detection of dies whose parameters vary significantly from other dies in a region, providing for detection of potentially faulty dies whose parameter measurements otherwise meet a fixed threshold set for the entire wafer, such as a Single Threshold Test Limit (STL) expectation for the wafer.

Figure 1:
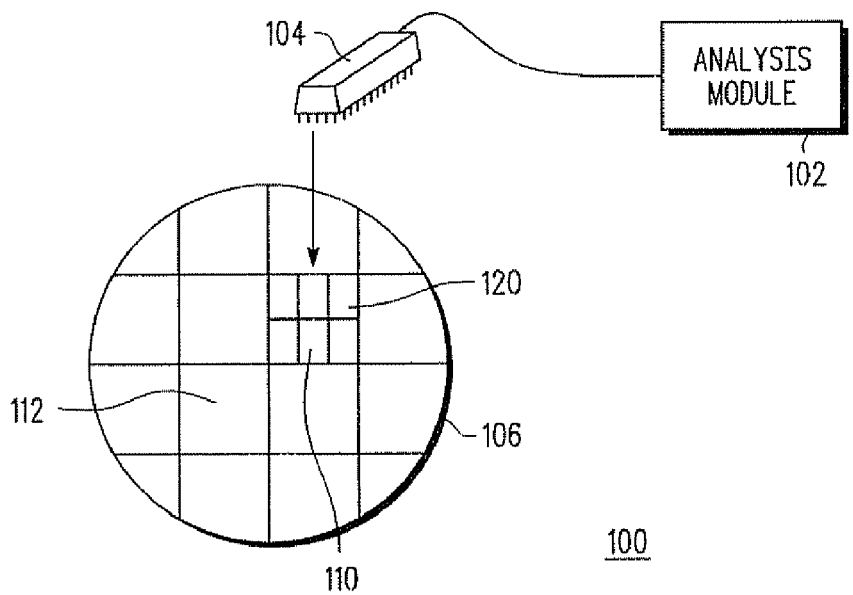
FIG. 1 is a block diagram of a particular embodiment of a wafer testing system.

Referring to FIG. 1, a wafer testing system 100 is illustrated in accordance with one embodiment of the present disclosure. The wafer testing system 100 includes an analysis module 102 and a wafer probe 104 to test a semiconductor wafer 106. The analysis module 102 includes a bi-directional connection to the wafer probe 104.

The semiconductor wafer 106 includes a number of regions, such as regions 110 and region 112. Each region includes a number of semiconductor dies, such as semiconductor die 120. In one embodiment, each region represents an area of the wafer 106 that is simultaneously testable by the wafer probe 104. As illustrated in FIG. 1, the dies of a region can be contiguous on the semiconductor wafer 106. In an alternative particular embodiment, a region can include semiconductor dies located in disparate areas of the semiconductor wafer 106.

The wafer probe 104 is configured to test the semiconductor dies of the semiconductor wafer 106 by applying test conditions to each die in a region and measuring parameter information for each die resulting from the application of the test conditions. For example, the wafer probe 104 can be configured to apply a voltage to each semiconductor die in a region so that a quiescent current value can be measured for each die. Other parameter types that can be measured include port input leakage, clock speed (e.g. maximum clock speed of a processor), transistor threshold voltage (including transistor threshold voltage for pnp transistors and transistor threshold voltage for npn transistors), and the like. The measured parameter for each die in a region is provided by the wafer probe 104 to the analysis module 102. The wafer probe 104 can be successively applied to each region so that parameter measurements are obtained for all semiconductor dies of the semiconductor wafer 106.

The analysis module 102 is a computer tool, software application, or other module configured to receive measured parameter information for a region under test from the wafer probe 104. Based on the received parameter information, the analysis module 102 can determine an adaptive threshold for a region of the semiconductor wafer 106. For example, the analysis module 102 can determine an adaptive threshold for the region 110 of the semiconductor wafer 106 based on the parameter measurements received for that region. The analysis module 102 can determine the adaptive threshold of a region in a number of ways, such as by averaging the parameter measurements for a region. In a particular embodiment, the analysis module 102 determines the adaptive threshold for a region by averaging the parameter measurements for the region and adding an offset to the average, such as N (e.g. N=3) standard deviations of the parameter measurements. Because the adaptive threshold for a region is based on the dies of that region, the adaptive threshold will be independent of the parameter measurements for other regions of the semiconductor wafer 106. For example, the adaptive threshold for region 110 is independent of the adaptive threshold for region 112. In a particular embodiment, the calculation process used to determine the adaptive threshold for one region can differ from the calculation process use to determine the adaptive threshold for another region of the semiconductor wafer 106.

In addition to determining the adaptive threshold for a region, the analysis module 102 can also be configured to determine a qualification status for the dies in a region by comparing each die to the adaptive threshold for the region. For example, the analysis module can determine a qualification status for the semiconductor die 120 of the semiconductor wafer 106 by comparing the parameter measurements for the semiconductor die 120 with the adaptive threshold associated with the region 110. The qualification status for a die depends on the relationship between the adaptive threshold for the die's region and the parameter measurement for the die. In a particular embodiment, the analysis module 102 indicates the qualification status for a die as "passed" when the parameter measurement is less than the adaptive threshold for the die region, and "failed" when the parameter measurement exceeds the die region. The qualification status for each die can also be expressed in graphical form indicating the measurement of each die and the adaptive threshold for the die region as described herein with reference to FIG. 2.

The analysis module 102 can also determine qualification status for a die based on a specified STL for the parameter. The specified STL is the same for each die of the semiconductor wafer 106, and does not vary by region, nor does it depend on the parameter measurements for any specific region. The analysis module 102 compares the parameter measurement for each die to the STL to determine the qualification status. Accordingly, the analysis module 102 can be configured to determine qualification status for dies based on both the STL and adaptive thresholds for each die region. Thus, use of the adaptive threshold by the analysis module 102 allows for identification of a die with parameter measurements that vary significantly from other dies in a region, indicating a potential problem with the die, even if the parameter measurement for the potentially faulty die does not exceed the STL. In addition, the analysis module 102 identifies dies with parameter measurements exceed the STL, even if the parameter measurements for that die are close to parameter measurements for other dies in the region. Thus, the ability of identify with potential problems is increased relative to a system which uses only an STL to perform die tests, thereby increasing the likelihood of identifying a potentially faulty die from the semiconductor wafer 106.

The analysis module 102 controls the wafer probe 104, and can instruct the probe to apply different testing conditions, such as the parameter to be measured or the operating conditions for the dies, to the semiconductor dies of the semiconductor wafer 106. The analysis module 102 can determine an adaptive threshold for each region for each set of testing conditions and determine a qualification status for each die under each testing condition based on the adaptive thresholds.

During operation, the wafer probe 104 is successively applied to each region to the semiconductor wafer 106. At each region, the analysis module 102 configures the wafer probe 104 to apply one or more test conditions to the region, and receives the parameter measurements associated with the test conditions for the dies in the region. Based on the received measurements, the analysis module 102 determines an adaptive threshold for the region. Based on the parameter measurements and the adaptive threshold, the analysis module 102 determines and stores a qualification status for each die in the region under the test condition. The qualification status can be stored in memory, in a data file, on a hard disk for later retrieval, in a database, and the like.

After testing a region under one set of test conditions to test one parameter, the analysis module 102 can reconfigure the wafer probe 104 for different test conditions, i.e. applying different operating characteristics to measure a different parameter. The analysis module 102 can determine a qualification status for each die in a region under each set of test conditions by developing a new adaptive threshold for each set of received parameter measurements.

Figure 2:
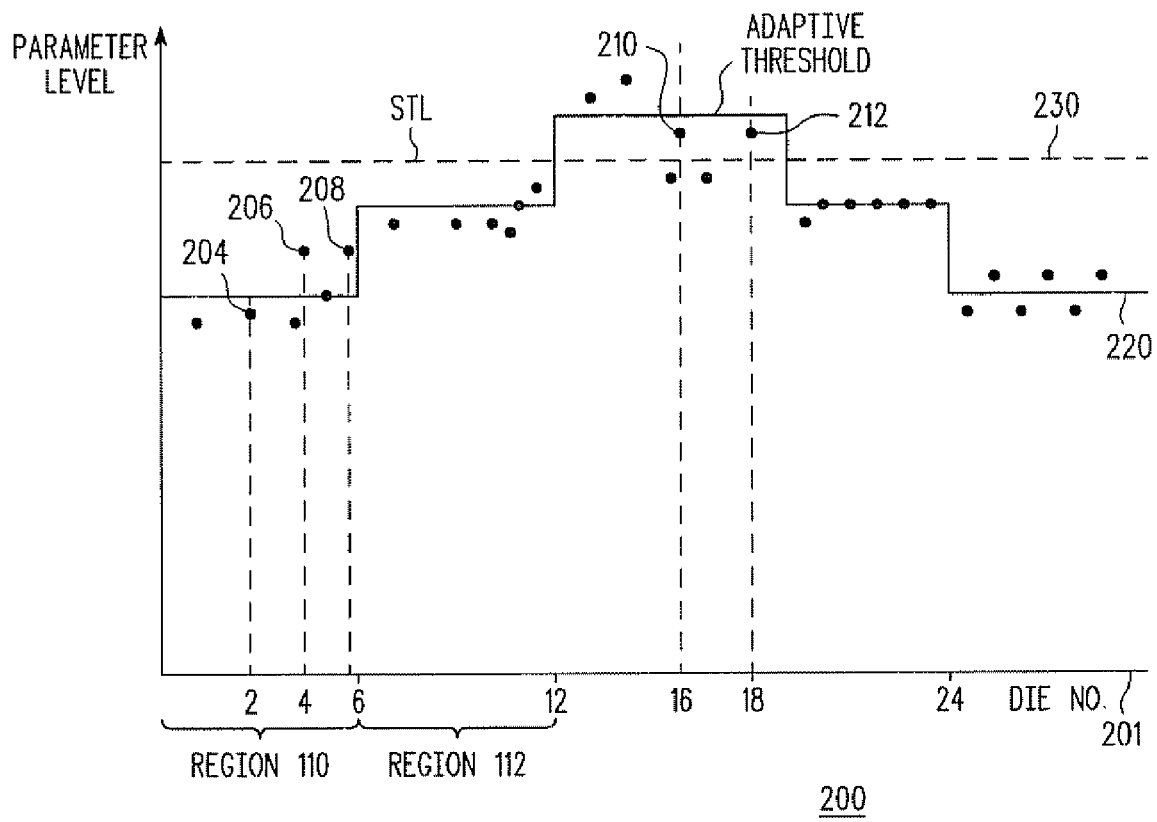
FIG. 2 is a diagram of example wafer test results that may be achieved with the wafer testing system of FIG. 1.

Referring to FIG. 2, a plot 200 representing an example set of parameter measurements of a semiconductor wafer is illustrated. The axis 201 of the plot 200 indicates a die number which corresponds to a position on the semiconductor wafer, while the axis 202 indicates a parameter level. Accordingly, each point in the plot 200 represents a parameter measurement for the associated die number.

In addition, a group of die numbers on the axis 201 are associated with a tested die region. For example, the die numbers 1 through 6 are associated with the region 110 and the die numbers 7-12 are associated with the region 112. The adaptive threshold curve 220 represents the adaptive threshold calculated for each region, and the value of the adaptive threshold curve 220 is based on the dies for that region. For example, the value of the adaptive threshold curve 220 for the semiconductor dies of region 112 is determined based on the parameter measurements for those dies according to an adaptive threshold calculation process for the qualification test.

The STL curve 230 represents the Single Threshold Test Limit for the wafer under test. As illustrated the STL curve 230 is represented as a level line because it does not vary for different regions of the semiconductor wafer.

The qualification status for each die under test is based on the relationship of the point (i.e., the measured parameter value) associated with the die to the adaptive threshold curve 220 and the STL curve 230. For example, the qualification status for die number 2 depends on the relationship of point 204 to the adaptive threshold curve 220 and the STL curve 230. In the illustrated embodiment, points at or below the adaptive threshold curve 220 and the STL curve 230 are associated with qualified dies, while points above either the adaptive threshold curve 220 or the STL curve 230 curve indicate that the associated dies have failed the qualification test for the measured parameter type. Accordingly, point 204 indicates that die number 2 has qualified for the measured parameter type, while points 206 and 208 indicate that dies 4 and 6 have failed. It will be appreciated that, under a conventional testing system that employs only the STL curve 230 and does not employ an adaptive threshold to qualify dies, both dies 4 and 6 would be qualified. However the variation of their measured parameter values from the other measured parameter values for the region (as represented by the adaptive threshold curve 220) indicates that dies 4 and 6 are potentially faulty. Accordingly, the use of the adaptive threshold curve 220 provides for a more refined testing threshold for each region of the die, increasing the ability to detect potentially faulty (or unqualified) dies.

In addition, the qualification status for a die depends on the relationship of the parameter measurement of the die to both the adaptive threshold curve 220 and the STL 230. For example, point 210 and point 212 indicate that dies 16 and 18 are not qualified for the tested parameter, because although the parameter measurements for those dies are below the adaptive threshold curve 220, they are above the STL curve 230. Thus, only dies which are at or below the specified limits of the STL curve 230 are indicated as qualified, so that all qualified dies will meet minimum testing specifications.

Figure 3:
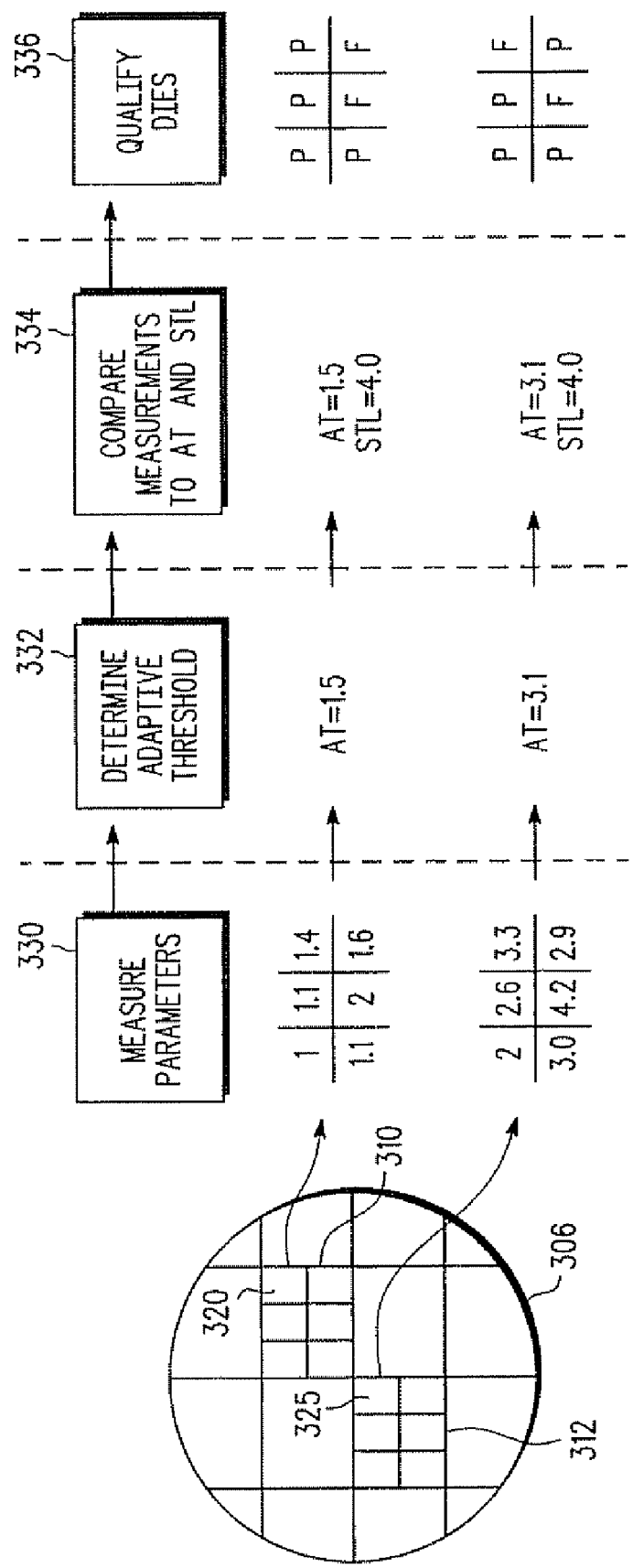
FIG. 3 is a diagram illustrating a particular embodiment of a method of testing dies of a semiconductor wafer based on the wafer testing system of FIG. 1.

Referring to FIG. 3, a diagram of a particular embodiment of a method of testing a semiconductor wafer is illustrated. FIG. 3 also illustrates an exemplary application of the method to regions 310 and 312 of a wafer 306, corresponding to the semiconductor wafer 106 of FIG. 1. At block 330, a wafer probe measures a parameter, such as quiescent current, for each region of the die 306. The measurements for the region 310 and 312 are illustrated in FIG. 3 in two grids, with each grid location the measurement for the corresponding die. For example, the parameter measurement for die 320 of region 310 is illustrated as 1.4.

Moving to block 332, an adaptive threshold is determined for each region based on a calculation process, such as for example, a statistical averaging. As illustrated, the exemplary adaptive threshold for region 310 is calculated to be 1.5 while the adaptive threshold for region 312 is calculated to be 3.1. It will be appreciated that the adaptive threshold values for each region have been chosen for illustrative purposes, rather than calculated using a particular formula.

Proceeding to block 334, the parameter measurements in each region are compared to the adaptive threshold for the region as well as the STL for the wafer 306. The method flow proceeds to block 336 and, based on the comparisons at block 330 the dies of each region are qualified. A "P" indicates that a die has passed the qualification test for the parameter under test, while an "F" indicates that the die has failed. For example, as illustrated die 320 of region 310 has passed the qualification test because its measured parameter value (1.4) is less than adaptive threshold value (1.5) of the region 310 and less than the STL (4.0) for the wafer. Conversely, die 325 of region 312 has failed the qualification test because the parameter measurement value (3.3) for die 325 exceeds the adaptive threshold limit (3.1) for region 312.

Figure 4:
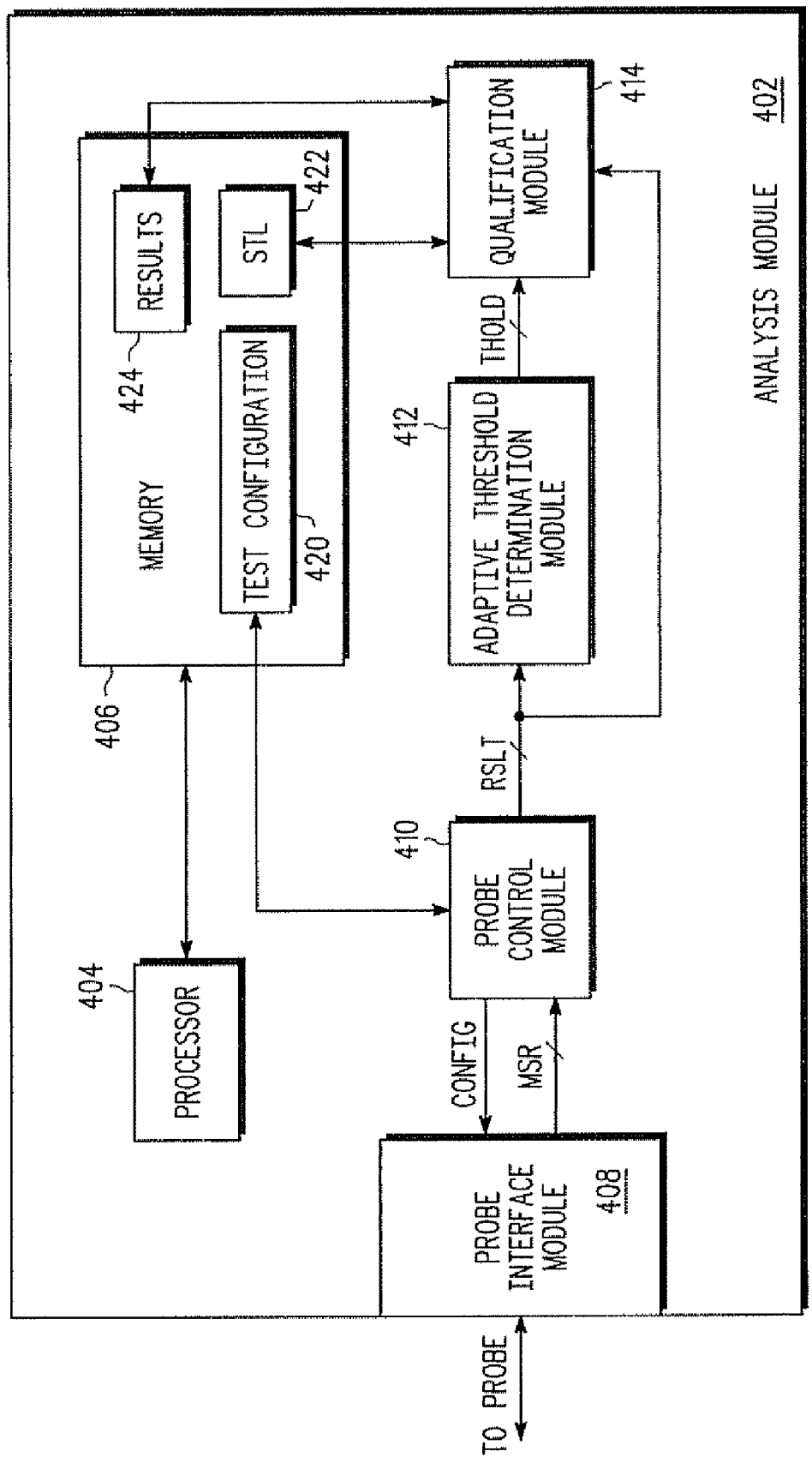
FIG. 4 is a block diagram of a particular embodiment of the analysis module of FIG. 1.

Referring to FIG. 4, a block diagram of a particular embodiment of an analysis module 402, corresponding to the analysis module 102 of FIG. 1, is illustrated. The analysis module 402 includes a processor 404, a memory 406, a probe interface module 408, a probe control module 410, an adaptive threshold determination module 412, and a qualification module 414. It will be appreciated that the modules 410, 412, and 414 can be hardware modules, or software modules stored at the memory 406 and implemented as instructions for execution by the processor 404 to perform the functions described below.

The processor 404 includes a bidirectional connection to the memory 406. The probe interface module 408 includes a bidirectional connection to a wafer probe (not shown in FIG. 4), an input to receive a signal CONFIG, and an output to provide a signal MSR. The probe control module 410 also includes an input to receive the signal MSR, a bidirectional connection to the memory 406, an output to provide a signal RSLT, and an output to provide the signal CONFIG. The adaptive threshold determination module 412 includes an input to receive the RSLT signal, and an output connected to provide a signal THOLD. The qualification module 414 includes an input to receive the THOLD signal, an input to receive the signal RSLT, and a bidirectional connection to the memory 406. The memory 406 stores data, including test configuration data 420, an STL value 422, and test result data 424.

The probe interface module 408 interfaces with the wafer probe to communicate test configuration information and receive test data based on the test configuration. The probe tests a region of a semiconductor wafer by measuring parameters for each die in the region under the test configuration. The probe interface module 408 receives the parameter measurements and provides them via the MSR signal.

The probe control module 410 accesses the test configuration data 420 and provides that configuration information to the wafer probe via the CONFIG signal. The CONFIG signal indicates to the wafer probe the test conditions for each region. The probe control module 410 also receives parameter measurement information via the MSR signal and provides the information via the RSLT signal after processing the information so that it is in useful form for downstream modules. For example, the probe control module 410 may receive parameter measurements for a wafer region in several portions, and can collect all measurements for a particular region before providing the measurements via the RSLT signal.

The adaptive threshold determination module 412 accesses parameter measurement information for a wafer region via the RSLT signal. Based on the received parameter measurement information the adaptive threshold determination module 412 determines an adaptive threshold for the region and provides the adaptive threshold to via the THOLD signal.

The qualification module 414 accesses an adaptive threshold for a region via the THOLD signal and the parameter measurements for the region via the RSLT signal. In addition, the qualification module 414 can access the STL 422 via the connection to the memory 406. Based on the received parameter measurements, the adaptive threshold, and the STL, the qualification module 414 determines a qualification indicator for each die in a region, and stores the qualification indicator in a storage location as test result data 424.

During operation, the probe control module 410 controls testing of a wafer based on the test configuration data 420. The probe control module 410 indicates to the probe, via the probe interface module 408, what operating conditions should be applied to a wafer region and what parameters should be measured. The probe control module 410 can indicate other information, such as which regions should be tested, which dies should be included in a region, and the like.

The probe control module 410 collects the parameter measurements for a region and provides the measurements to the adaptive threshold determination module 412, which determines an adaptive threshold for a region. The qualification module 414 uses the adaptive threshold and the STL 422 to determine a qualification indicator for each die in the region, and stores the indicators in the results 424. These results can be analyzed to determine which dies have qualified under a particular parameter test. The adaptive threshold developed by the adaptive threshold determination module 412 helps ensure that dies with measurements that significantly vary from the measurements for other dies in the same region are not qualified under the parameter test.

Figure 5:
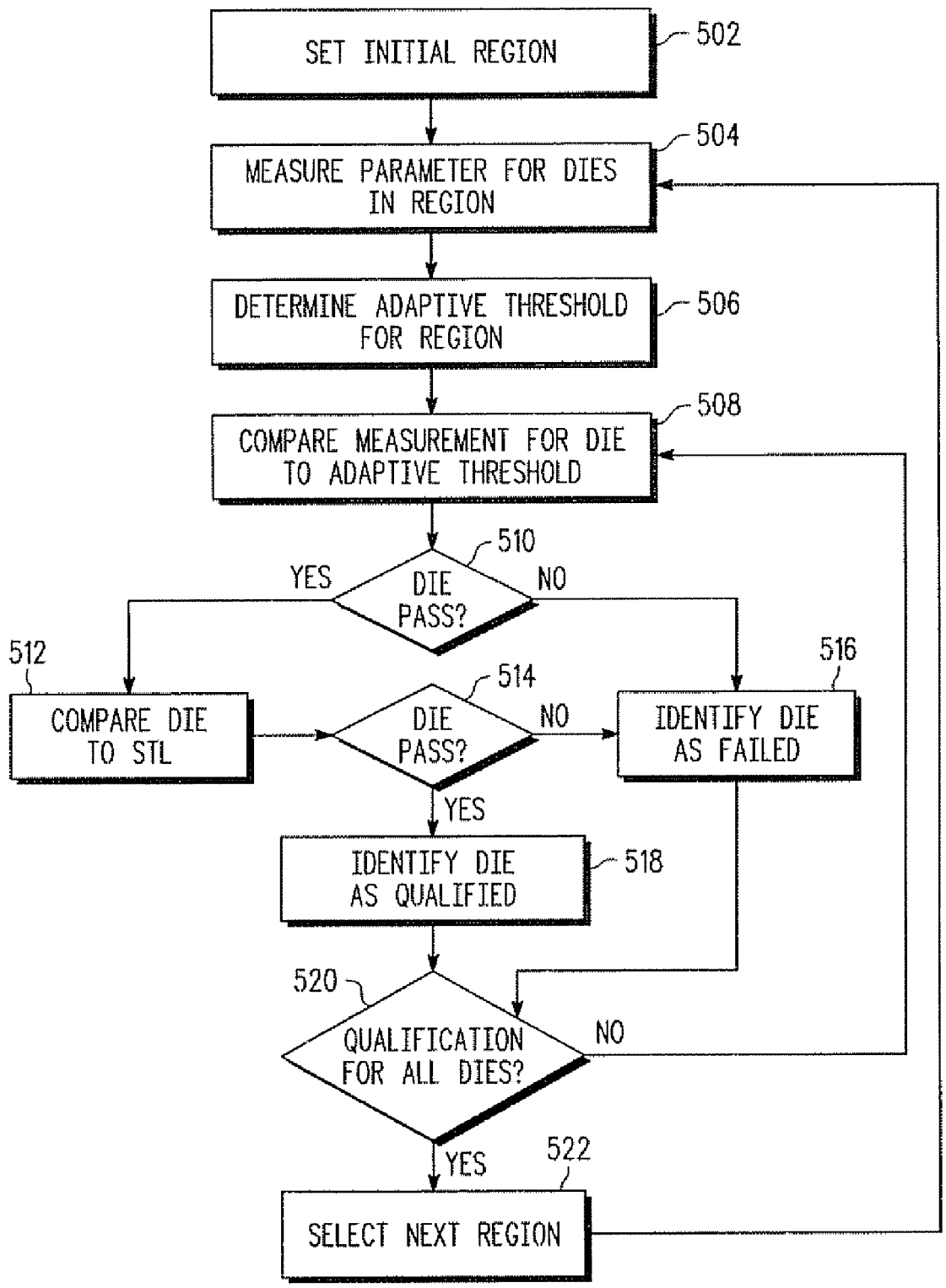
FIG. 5 is a flow diagram illustrating a particular embodiment of a method of testing dies of a semiconductor wafer.

Referring to FIG. 5, a flow diagram of a particular embodiment of a method for testing a semiconductor wafer is illustrated. At block 502, an initial region of the wafer to be tested is set. The region can be a contiguous set of dies in the wafer, dies which are remotely located on the wafer, or other set of dies.

At block 504, a parameter is measured for each die in the selected region. The parameter can be measured by applying test conditions to each die and applying a probe to the die to measure a resulting parameter. Proceeding to block 506, an adaptive threshold is determined for the region under test based on the parameter measurements for dies of the region. In a particular embodiment the adaptive threshold is determined by removing the largest parameter measurements and averaging the remaining parameter measurements, as set forth in the following formula:

$$P_{AVG} = \frac{\sum_{0}^{n-2} X_j - \text{Max}[X]}{n-1}$$

where Max[X] are the largest parameter measurements, $P_{AVG}$ is the average of the remaining parameter measurements, X is the set of parameter measurements and n is the number of parameter measurements for the region under test (e.g. the number of dies in the region. It will be appreciated that the above formula assumes that only one parameter measurement value is included in Max[X]. However, the number of parameter measurement values included in Max[X] (i.e. the number of parameter measurement values removed before averaging) can be selected based upon a predicted number of potentially faulty dies in a region, and the averaging formula adjusted accordingly. The adaptive threshold (AT) can also be determined by adding an offset to the $P_{AVG}$ value. In a particular embodiment, the adaptive threshold is calculated according to the following formula:

$$AT = P_{AVG} + 3\sigma$$

where σ is the standard deviation of the parameter measurement values for the region.

In a particular embodiment, the adaptive threshold (AT) can be determined based on the following formula:

$$AT = M + K \times \sigma$$

where M is the median of the parameter measurement values. K is an error factor based on the number of expected faulty dies, expressed in parts per million. In a particular embodiment, K is between 6 and 12 if the number of predicted faults is greater than 10 parts per million, and K is between 12 and 20 if the number of predicted faults is less than 10 parts per million. The value of σ can be expressed according to the following formula:

$$\sigma = \frac{(0.95 * \text{Max}[X] - 0.5 * \text{Max}[X])}{1.64}$$

where Max[X] is the highest measured parameter value.

Proceeding to block 508, the parameter measurement for a die in the region under test is compared to the adaptive threshold. Moving to decision block 510, it is determined whether the die is qualified based on the comparison at block 508. The qualification criteria can depend on the type of test being performed. For example, for some tests a die passes the qualification test for the adaptive threshold if it is less than the threshold. In other tests, a die may pass the qualification test for the adaptive threshold when it exceeds the threshold. Other qualification criteria are possible.

If, at decision block 508, it is determined that the die does not pass the qualification criteria for the adaptive threshold, the method flow moves to block 516 and the die is identified as a failed die. The method proceeds to decision block 520 and it is determined whether qualification has been performed all dies in the region. If not, the method flow returns to block 508 and the parameter measurement for another die in the region is compared to the adaptive threshold. If, at block 520 qualification has been performed for all dies in the region, the method flow moves to block 522 and the next region of the die is selected. The method flow then returns to block 504 and the parameters for the selected region are tested.

Returning to block 510, if it is determined that the parameter measurement for the selected die passes the adaptive threshold according to the qualification criteria the method flow moves to block 512 and the parameter measurement is compared to the STL for the wafer under test. Moving to decision block 514, it is determined whether the parameter measurement passes the STL according to qualification criteria for the STL. If the die does not pass, the method flow moves to block 516 and the die associated with the parameter measurement is identified as failed. If, at block 514, it is determined that the parameter measurement passes the STL, the method flow moves to block 518 and the die is identified as qualified. The method flow then proceeds to block 520 where it is determined whether qualification has been performed for all dies in the region for the parameter under test.

Figure 6:
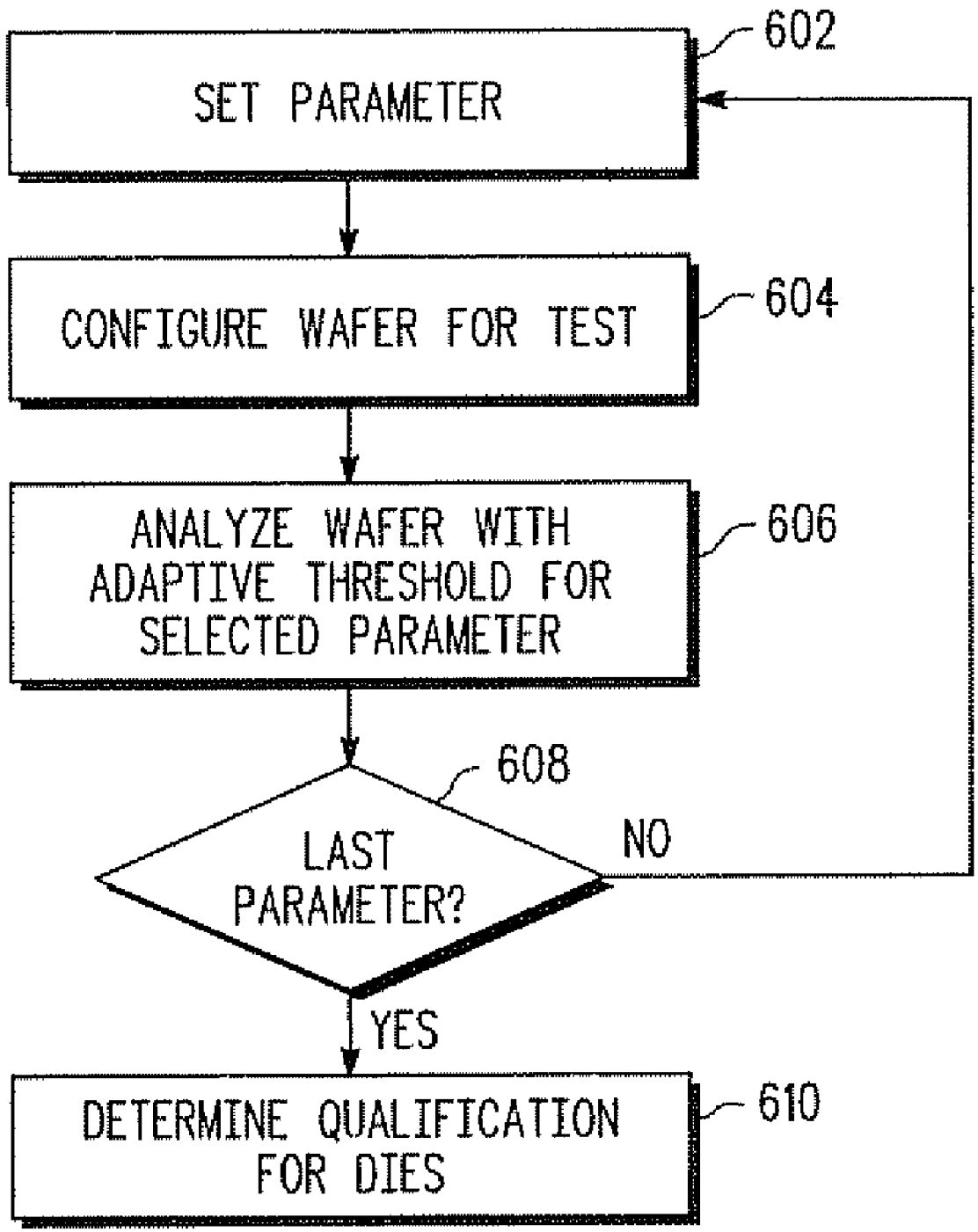
FIG. 6 is a flow diagram illustrating a particular embodiment of a method of testing multiple parameters for dies of a semiconductor wafer.

Referring to FIG. 6, a flow diagram of a particular embodiment of a method of testing a semiconductor wafer for multiple parameters is illustrated. At block 602, a parameter to be tested is selected. Moving to block 604, the wafer under test is configured so that the selected parameter can be tested. The wafer can be configured as a whole, or each region of the wafer can be configured as the regions are tested.

Proceeding to block 606, the wafer dies are analyzed using adaptive thresholds based on the selected parameter. For example, if the selected parameter is quiescent current, the adaptive thresholds will be quiescent current thresholds. The analysis at block 606 can be performed according to the method described above with respect to FIG. 5.

Moving to decision block 608, it is determined if all parameters to be tested have been tested for the wafer. If not, the method flow returns to block 602 and a different parameter to be tested is selected. If all parameters have been tested, the method flow moves to block 610 and a qualification status for each die of the wafer is determined based on the results of the analysis at block 606 for each tested parameter. Different qualification criteria can be used to determine the qualification status of a die. For example, if the results of the analysis at block 606 indicate that a die has failed qualification under any one of the parameters tested, then that die can be indicated as a failed die. In another particular embodiment, a die is indicated as failed if it has failed qualification for a specified number of tested parameters. Accordingly, the disclosed method provides for applying adaptive thresholds for multiple parameters under test, increasing the likelihood that dies with potential problems will be identified.

In this document, relational terms such as "first" and "second", and the like, may be used solely to distinguish one entity or action from another entity or action without necessarily requiring or implying any actual such relationship or order between such entities or actions. The terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element. The term "or" are intended to cover an inclusive "or" such that if both conditions of the "or" conditional are satisfied, then the conditional is satisfied. The term "range" can include a range that includes only a single value.

The term "another", as used herein, is defined as at least a second or more. The terms "including", "having", or any variation thereof, as used herein, are defined as comprising. The term "coupled", as used herein with reference to electro-optical technology, is defined as connected, although not necessarily directly, and not necessarily mechanically.

The terms "assert" or "set" and "negate" (or "deassert" or "clear") are used when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

As used herein, the term "bus" is used to refer to a plurality of signals or conductors that may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Other embodiments, uses, and advantages of the disclosure will be apparent to those skilled in the art from consideration of the specification and practice of the disclosure disclosed herein. The specification and drawings should be considered exemplary only, and the scope of the disclosure is accordingly intended to be limited only by the following claims and equivalents thereof.

What is claimed is:

1. A method, comprising:
    accessing at a computer processor first test data comprising a first plurality of parameter measurement values, each of the first plurality of parameter measurement values associated with a corresponding one of a first subset of semiconductor dies of a wafer comprising a first region and a second region, the first subset associated with the first region, wherein the first plurality of parameter measurements comprise parameter measurements of a first type, the first type selected from the group consisting of: quiescent current supply measurements, clock speed measurements, port input leakage measurements, and transistor threshold voltage measurements;
    determining at the computer processor a first parameter threshold for the first subset of semiconductor dies based on the first plurality of parameter measurement values and not based on a second plurality of parameter measurement values associated with the second region, the first parameter threshold comprising a first adaptive threshold associated with the first subset of semiconductor dies;
    determining at the computer processor a first qualification status of a first die of the first subset based on a relationship between the first parameter threshold and one of the first plurality of parameter measurement values corresponding to the first die; and
    storing at the computer processor a value representative of the first qualification status of the first die.

2. The method of claim 1, further comprising:
    accessing at the computer processor second test data comprising the second plurality of parameter measurement values, each of the second plurality of parameter measurement values associated with a corresponding one of a second subset of semiconductor dies of the wafer;
    determining at the computer processor a second parameter threshold for the second subset of semiconductor dies based on the second plurality of parameter measurement values;
    determining at the computer processor a second qualification status of a second die of the second subset based on a relationship between the second parameter threshold and one of the second plurality of parameter measurement values corresponding to the first die; and
    storing the first qualification status of the second die.

3. The method of claim 2, wherein determining the first parameter threshold comprises determining the first parameter threshold based on a first calculation process and determining the second parameter threshold comprises determining the first parameter threshold based on the first calculation process.

4. The method of claim 2, determining the first parameter threshold comprises determining the first parameter threshold with a based on a first calculation process and determining the second parameter threshold comprises determining the first parameter threshold based on a second calculation process, the second calculation process different from the first.

5. The method of claim 2, wherein the first region includes dies located in disparate areas of the wafer.

6. The method of claim 1, wherein determining the first parameter threshold comprises determining an average of the first plurality of parameter measurements.

7. The method of claim 6, wherein determining the first parameter threshold further comprises adjusting the average by an offset.

8. The method of claim 7, wherein the offset is three standard deviations of the first plurality of parameter measurements.

9. The method of claim 1, further comprising:
    accessing at the computer device second test data comprising a second plurality of parameter measurement values, each of the second plurality of parameter measurements associated with a corresponding one of the first subset of semiconductor dies;
    determining at the computer device a second parameter threshold for the first subset of semiconductor dies based on the second plurality of parameter measurement values;
    determining at the computer device a second qualification status of the first die based on a relationship between the second parameter threshold and one of the second plurality of parameter measurement values corresponding to the first die; and
    storing at the computer device a value representative of the second qualification status of the first die.

10. The method of claim 9, wherein the first plurality of parameter measurements is associated with a first parameter type the second plurality of parameter measurements are associated with a second parameter type.

11. The method of claim 9, wherein the first plurality of parameter measurements is associated with a first configuration of the first die, and the second plurality of parameter measurements are associated with a second configuration of the second die.

12. The method of claim 9, wherein determining a first qualification status of the first die further comprises determining the first qualification status based on a relationship between a predetermined specified threshold associated with the wafer and the one of the first plurality of parameter measurement values corresponding to the first die.

13. A device comprising computer readable media, the computer readable media comprising instructions to manipulate a processor to execute the instruction, the instructions comprising:
    instructions to access first test data comprising a first plurality of parameter measurement values, each of the first plurality of parameter measurement values associated with a corresponding one of a first subset of semiconductor dies of a wafer comprising a first region and a second region, the first subset associated with the first region, wherein the first plurality of parameter measurements comprise parameter measurements of a first type, the first type selected from the group consisting of: quiescent current supply measurements, clock speed measurements, port input leakage measurements, and transistor threshold voltage measurements;
    instructions to determine a first parameter threshold for the first subset of semiconductor dies based on the first plurality of parameter measurement values and not based on a second plurality of parameter values associated the second region;
    instructions to determine a first qualification status of a first die of the first subset based on a relationship between the first parameter threshold and one of the first plurality of parameter measurement values corresponding to the first die; and instructions to store the first qualification status of the first die.

14. The device of claim 13, wherein the instructions further comprise:

instructions to access second test data comprising the second plurality of parameter measurement values, each of the second plurality of parameter measurements associated with a corresponding one of a second subset of semiconductor dies of the wafer;

instructions to access a second parameter threshold for the second subset of semiconductor dies based on the second plurality of parameter measurement values;

instructions to determine a second qualification status of a second die of the second subset based on a relationship between the second parameter threshold and one of the second plurality of parameter measurements corresponding to the first die; and instructions to store the first qualification status of the second die.

15. The device of claim 14, wherein the first region includes dies located in disparate areas of the wafer.

16. The device of claim 13, wherein the instructions to determine the first parameter threshold comprise instructions to determine the first parameter threshold based on a first calculation process and determining the second parameter threshold comprises determining the first parameter threshold based on the first calculation process.

17. The device of claim 13, wherein the instructions to determine the first parameter threshold comprise instructions to determine the first parameter threshold based on a first calculation process and determining the second parameter threshold comprises determining the first parameter threshold based on a second calculation process, the second calculation process different from the first.

18. The device of claim 13, wherein the instructions further comprise:

instructions to access second test data comprising a second plurality of parameter measurement values, each of the second plurality of parameter measurement values associated with a corresponding one of the first subset of semiconductor dies;

instructions to determine a second parameter threshold for the first subset of semiconductor dies based on the second plurality of parameter measurement values;

instructions to determine a second qualification status of the first die based on a relationship between the second parameter threshold and one of the second plurality of parameter measurement values corresponding to the first die; and instructions to store a value representing the second qualification status of the first die.

19. A device, comprising:

a first interface module configured to receive first test data comprising a first plurality of parameter measurement values, each of the first plurality of parameter measurement values associated with a corresponding one of a first subset of semiconductor dies of a wafer, wherein the first plurality of parameter measurements comprise parameter measurements of a first type, the first type selected from the group consisting of: quiescent current supply measurements, clock speed measurements, port input leakage measurements, and transistor threshold voltage measurements;

an adaptive threshold configuration module configured to determine a first parameter threshold for the first subset of semiconductor dies;

a qualification module configured to determine a first qualification status of a first die of the first subset based on a relationship between the first parameter threshold and one of the first plurality of parameter measurement values corresponding to the first die; and a memory configured to store a value representative of the first qualification status.

* * * * *